US005482814A

United States Patent [19]
Ooi et al.

[11] Patent Number: 5,482,814
[45] Date of Patent: Jan. 9, 1996

[54] THERMAL DEVELOPING PHOTOSENSITIVE MEMBER AND IMAGE FORMING METHOD USING THE THERMAL DEVELOPING PHOTOSENSITIVE MEMBER

[75] Inventors: Takehiko Ooi; Tetsuro Fukui, both of Yokohama; Motokazu Kobayashi, Kawasaki; Kazunori Ueno, Tokyo; Kenji Kagami, Atsugi; Masao Suzuki, Tokyo; Katsuya Nishino, Hiratsuka, all of Japan

[73] Assignee: Canon Kabushiki Kaisha, Tokyo, Japan

[21] Appl. No.: 275,275

[22] Filed: Jul. 15, 1994

[30] Foreign Application Priority Data

Jul. 15, 1993 [JP] Japan .................................. 5-175584
Jul. 19, 1993 [JP] Japan .................................. 5-178221
Sep. 28, 1993 [JP] Japan .................................. 5-241478

[51] Int. Cl.⁶ .......................... G03C 1/498; G03C 1/26
[52] U.S. Cl. .................... 430/203; 430/571; 430/577; 430/578; 430/581; 430/584; 430/583; 430/585; 430/619; 430/617
[58] Field of Search ................... 430/619, 571, 430/577, 578, 581, 581, 585, 583, 203, 617

[56] References Cited

U.S. PATENT DOCUMENTS

| | | | |
|---|---|---|---|
| 2,681,294 | 6/1954 | Beguin . | |
| 2,865,917 | 12/1958 | Fry et al. | 430/577 |
| 3,080,254 | 3/1963 | Grant . | |
| 3,557,101 | 1/1971 | Taber | 430/578 |
| 3,589,903 | 6/1971 | Birkeland . | |
| 3,635,719 | 1/1972 | Ohkubo et al. . | |
| 4,123,274 | 10/1978 | Knight et al. . | |
| 4,220,709 | 9/1980 | de Mauriac . | |
| 5,171,657 | 12/1992 | Kagami et al. | 430/271 |
| 5,187,041 | 2/1993 | Mouri et al. | 430/201 |
| 5,258,281 | 11/1993 | Tanaka et al. | 430/619 |
| 5,258,282 | 11/1993 | Kagami et al. | 430/619 |

FOREIGN PATENT DOCUMENTS

| | | |
|---|---|---|
| 43-4921 | 2/1968 | Japan . |
| 43-4924 | 2/1968 | Japan . |
| 44-30270 | 12/1969 | Japan . |
| 45-18416 | 6/1970 | Japan . |
| 46-6074 | 12/1971 | Japan . |
| 47-11113 | 4/1972 | Japan . |
| 50-32927 | 3/1975 | Japan . |
| 55-42375 | 10/1980 | Japan . |
| 57-30828 | 2/1982 | Japan . |
| 57-138630 | 8/1982 | Japan . |
| 57-147627 | 9/1982 | Japan . |
| 58-107534 | 2/1983 | Japan . |
| 58-115638 | 7/1983 | Japan . |
| 58-118639 | 7/1983 | Japan . |
| 64-24245 | 7/1983 | Japan . |
| 59-55429 | 3/1984 | Japan . |
| 61-129642 | 6/1988 | Japan . |
| 64-8809 | 2/1989 | Japan . |
| 3-135564 | 6/1991 | Japan . |

*Primary Examiner*—Thorl Chea
*Attorney, Agent, or Firm*—Fitzpatrick, Cella, Harper & Scinto

[57] ABSTRACT

A heat developing photosensitive member including: a photosensitive layer containing at least an organic silver salt, a reducing agent and a photosensitive silver halide or a photosensitive silver halide forming agent; and a supporting member for supporting the photosensitive layer thereon, wherein merocyanine dye having a structure in which a thiazole nucleus or selenazole nucleus and hydantoin nucleus, thiohydantoin nucleus or selenohydantoin nucleus are combined with each other by a combining group having a methine group is contained in the photosensitive layer.

6 Claims, No Drawings

THERMAL DEVELOPING PHOTOSENSITIVE MEMBER AND IMAGE FORMING METHOD USING THE THERMAL DEVELOPING PHOTOSENSITIVE MEMBER

BACKGROUND OF THE INVENTION

1. Field of the Invention

The present invention relates to a thermal developing photosensitive member capable of forming an image by a dry process and an image forming method using the thermal developing photosensitive member.

2. Description of the Prior Art

A sliver-salt photographing method using a silver halide is a recording technology exhibiting excellent sensitivity and gradient expression characteristics and therefore used widely. However, the method involving to perform the process after exposing the image to light in a wet manner has suffered from unsatisfactory working property, convenience and safety.

On the other hand, a study of dry material, by which the wet process can be omitted, has been made and resulted in disclosures in Japanese Patent Publication No. 43-4921 and Japanese Patent Publication No. 43-4924. The foregoing disclosure each uses a photosensitive silver halide in a quantity as a catalyst and a non-photosensitive organic silver salt is used as an image forming material. The reason why the organic silver salt serves as the image forming material is considered to be due to the following mechanism.

(1) Exposure to an image causes a latent image to be formed on the photosensitive silver halide in a quantity which acts as a catalyst; and (2) The latent image serves as a catalyst and the photosensitive member is therefore heated, causing the organic silver salt and a reducing agent to take part in redox reactions to reduce the organic silver salt into silver which forms the image.

The heat developing photosensitive member has an advantage that it forms an image by a dry process in place of the wet process. Therefore, it has been used as an industrial photosensitive member in a variety of fields, for example, image communication, medical care and computer output fields. The heat developing photosensitive member exhibits excellent photosensitivity because the silver halide is contained as the photosensitive element. Furthermore, sensitization to a visible region can easily be performed.

Recently, a semiconductor laser has been developed and utilized which exhibits low cost, small size, light weight and excellent output efficiency as compared with a gas laser. Therefore, use of the low-cost, small and light laser beam source and the heat developing photosensitive member will enable a low-cost, compact and high performance dry image recording system to be realized.

A conventional gelatin-type silver halide photosensitive member for a wet process has employed a cyanine dye for the purpose of improving the photosensitivity with respect of long wave light, particularly, red light. However, the cyanine dye suffers excessively unsatisfactory sensitizing efficiency with respect to the heat developing photosensitive member for the dry process and therefore it has been considered to be inadequate for the foregoing use.

Although the silver halide photosensitive member for the wet process is able to decolor a sensitizing dye by the wet process, the conventional heat developing photosensitive member cannot decolor it sufficiently in a heating process and therefore raises a problem in that an image having a lower optical density cannot easily be obtained. If the sensitizing dye is decreased in quantity in order to lower optical density, problems of unsatisfactory photosensitivity and defective resolution arise.

The conventional heat developing photosensitive member has another problem in that the photosensitivity deteriorates excessively if it is stored in an unused manner for a long time.

SUMMARY OF THE INVENTION

An object of the present invention is to provide a heat developing photosensitive member and an image forming method using the heat developing photosensitive member with which a compact and economical image system can be constituted. Because the heat developing photosensitive member is utilized by a semiconductor laser or an LED or the like having an oscillation wavelength in a red or near infrared ray region, fog can substantially be prevented and excellent storing characteristics can be realized.

According to one aspect of the present invention, there is provided a heat developing photosensitive member comprising: a photosensitive layer containing at least an organic silver salt, a reducing agent and a photosensitive silver halide or a photosensitive silver halide forming agent; and a supporting member for supporting the photosensitive layer thereon, wherein a merocyanine dye having a structure in which a thiazole nucleus or selenazole nucleus and hydantoin nucleus, thiohydantoin nucleus or selenohydantoin nucleus are combined with each other by a combining group having a methine group is contained in the photosensitive layer.

According to another aspect of the present invention, there is provided a heat developing photosensitive member comprising: a photosensitive layer containing at least an organic silver salt, a reducing agent and a photosensitive silver halide or a photosensitive silver halide forming agent; and a supporting member for supporting the photosensitive layer thereon, wherein a merocyanine dye having a structure in which oxazole nucleus, thiazole nucleus or selenazole nucleus and hydantoinilidene-hydantoin nucleus having four substituents, hydantoinilidene-thiohydantoin nucleus having four substituents or hydantoinilidene-selinohydantoin nucleus having four substituents are combined with each other by a combining group having a methine group is contained in the photosensitive layer.

According to another aspect of the present invention, there is provided a heat developing photosensitive member comprising: a photosensitive layer containing at least an organic silver salt, a reducing agent and a photosensitive silver halide or a photosensitive silver halide forming agent; and a supporting member for supporting the photosensitive layer thereon, wherein two oxazole nuclei, two thiazole nuclei, or oxazole nucleus and thiazole nucleus at two ends thereof and further comprising, between the nuclei at the two ends, one nucleus selected from a group consisting of oxazolidone nucleus, thiazolidone nucleus and dihydroimidazolidone nucleus is contained in the photosensitive layer.

According to another aspect of the present invention, there is provided an image forming method having an arrangement that an image is exposed to a heat developing photosensitive member and heating is performed to form an image.

Other and further objects, features and advantages of the invention will be appear more fully from the following description.

DESCRIPTION OF THE PREFERRED EMBODIMENTS

A heat developing photosensitive member according to the present invention comprises, on a supporting member thereof, a photosensitive layer containing at least an organic silver salt, a reducing agent, a photosensitive silver halide or a photosensitive silver halide forming agent, and a sensitizing dye.

The sensitizing dye for use in the present invention is as follows.

Sensitizing Agent (a): merocyanine dye having a structure in which a thiazole nucleus or selenazole nucleus and hydantoin nucleus, thiohydantoin nucleus or selenohydantoin nucleus are combined with each other by a combining group having a methine group.

Sensitizing Agent (b): merocyanine dye having a structure in which oxazole nucleus, thiazole nucleus or selenazole nucleus and hydantoinilidene-hydantoin nucleus having four substituents, hydantoinilidene-thiohydantoin nucleus having four substituents or hydantoinilidene-selenohydantoin nucleus having four substituents are combined with each other by a combining group having a methine group.

Sensitizing Agent (c): merocyanine dye having a structure comprising two oxazole nuclei, two thiazole nuclei, or oxazole nucleus and thiazole nucleus at two ends thereof and further comprising, between the nuclei at the two ends, one nucleus selected from a group consisting of oxazolidone nucleus, thiazolidone nucleus and dihydroimidazolidone nucleus.

Use of any one of the foregoing sensitizing dyes (a), (b) and (c) enables excellent photosensitivity with respect to red or near infrared region light, particularly, light having a wavelength 640 nm to 750 nm. Furthermore, the fog density can be lowered.

The sensitizing agent (a) will now be described.

As the thiazole nucleus, it is preferable that aromatic thiazole nucleus be employed. In particular, it is preferable that benzothiazole nucleus or naphthothiazole be employed. In particular, it is preferable that naphthothiazole be employed.

As the selenazole nucleus, it is preferable that aromatic selenazole nucleus be employed. In particular, benzoselenazole nucleus or naphthoselenazole nucleus be employed. It is most preferable that naphthoselenazole be employed.

Among hydantoin nucleus, thiohydantoin nucleus and selenohydantoin nucleus, it is preferable that thiohydantoin nucleus or selenohydantoin nucleus be employed. In particular, it is preferable that thiohydantoin nucleus be employed.

It is preferable that the number of methines in the combining group be 2 to 8, more preferably 4 to 6. The methine chain may have a substituent.

As the sensitizing dye (a), it is preferable that substance expressed by the following general formula (I) be employed.

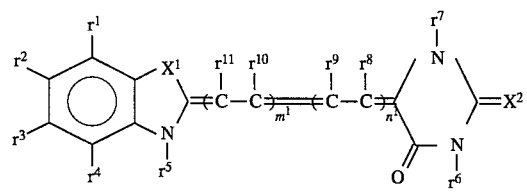

where $r^1$, $r^2$, $r^3$ and $r^4$ respectively are hydrogen atom, halogen atom, alkyl group, alkoxy group, alkenyl group, aralkyl group, hydroxyl group, aryl group, carboxylic group, alkoxycarbonyl group, cyano group, trifluoromethyl group, amino group, acylamide group, acyl group, acyloxyl group, alkoxycarbonylamino group or carboalkoxy group, $r$ and $r^2$, $r^2$ and $r^3$ or $r^3$ and $r^4$ may combined with each other to form a five or six-membered ring, $r^5$, $r^6$ and $r^7$ respectively are alkyl group, alkenyl group, aryl group or aralkyl group, $r^8$, $r^9$, $r^{10}$ and $r^{11}$ respectively are hydrogen atom, halogen atom, alkyl group, alkoxy group, aryl group or amino group, $r^8$ and $r^9$, $r^{10}$ and $r^{11}$, $r^8$ and $r^{10}$ or $r^9$ and $r^{11}$ may be combined with each other to form a ring, $X^1$ is sulfur atom or selene atom, $X^2$ is oxygen atom, sulfur atom or selene atom, $m^1$ and $n^2$ are each an integer 0 to 3 that are not zero simultaneously, $r^1$ to $r^{11}$ may have a substituent or not, it is preferable that $X^1$ and $X^2$ be sulfur atoms, it is preferable that each of $r^1$ to $r^4$ be hydrogen atom, halogen atom, alkyl group, alkenyl group, aryl group or aralkyl group, in particular, it is preferable that $r^1$ and $r^2$ or $r^3$ and $r^4$ be combined with each other to form a naphthonucleus, the naphthonucleus may be substituted with an alkyl group or a halogen atom, it is preferable that each of $r^5$ to $r^7$ be an alkyl group, it is preferable that $r^8$ to $r^{11}$ be hydrogen or alkyl group, and $m^1$ and $n^1$ be integers holding a relationship $m^1+n^1=2$.

Preferred examples of the sensitizing dye (a) are as follows:

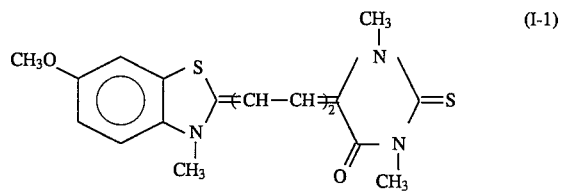

(I-1)

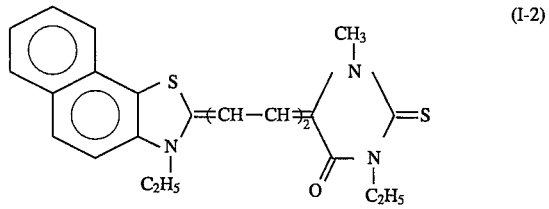

(I-2)

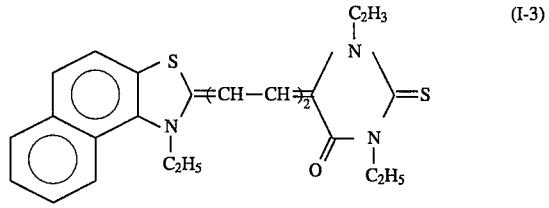

(I-3)

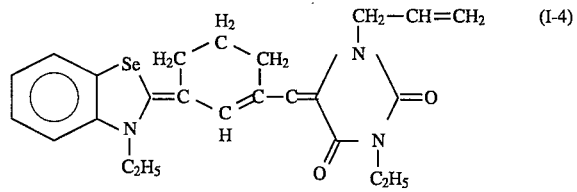

(I-4)

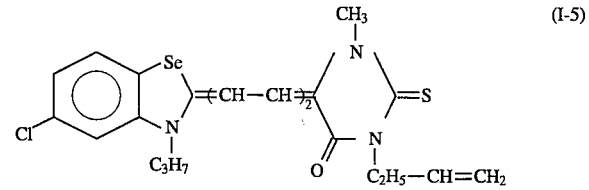

(I-5)

-continued

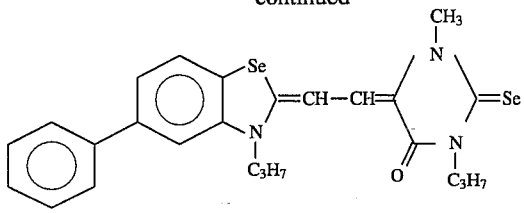 (I-6)

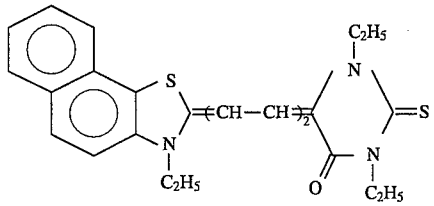 (I-7)

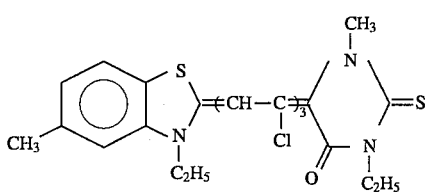 (I-8)

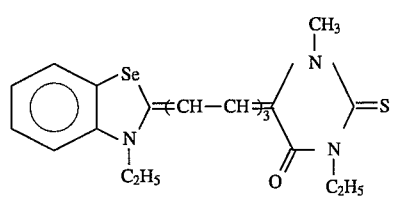 (I-9)

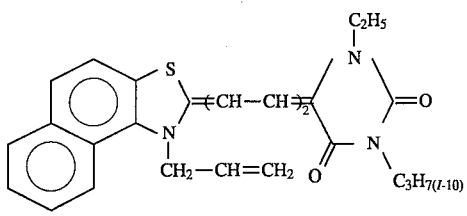 (I-10)

The sensitizing dye (b) will now be described.

As the oxazole nucleus, it is preferable that aromatic oxazole nucleus be employed, more preferably benzoxazole nucleus be employed.

As the thiazole nucleus, it is preferable that aromatic thiazole nucleus be employed, more preferably benzothiazole nucleus be employed.

As the selenazole nucleus, it is preferable that aromatic selenazole nucleus be employed, more preferably benzoselenazole nucleus be employed.

The hydantoinilidene-hydantoin nucleus having four substituents means 1,1',3,3'-substituted hydantoinilidene-hydantoin nucleus. The hydantoinilidene-thiohydantoin nucleus having four substituents and the hydantoinilidene-seleno hydantoin nucleus having four substituents as well as mean the same. Among (i) hydantoinilidene-hydantoin nucleus having four substituents, (ii) hydantoinilidene-thiohydantoin nucleus having four substituents and (iii) hydantoinilidene-selenohydantoin nucleus having four substituents, it is preferable that (ii) or (iii) be employed, more preferably (ii) be employed.

It is preferable that the number of methines in the combining group be 2 to 8, more preferably 4 to 6. The methine chain may have a substituent.

It is preferable that the sensitizing pigment (b) be a substance expressed by the following general formula (II).

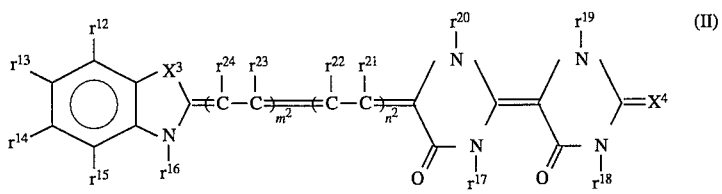 (II)

where $r^{12}$, $r^{13}$, $r^{14}$ and $r^{15}$ respectively are hydrogen atom, halogen atom, alkyl group, alkoxy group, alkenyl group, aralkyl group, hydroxyl group, aryl group, carboxylic group, alkoxycarbonyl group, cyano group, trifluoromethyl group, amino group, acylamide group, acyl group, acyloxyl group, alkoxycarbonylamino group or carboalkoxy group, $r^{12}$ and $r^{13}$, $r^{13}$ and $r^{14}$ or $r^{14}$ and $r^{15}$ may combined with each other to form a five or six-membered ring, $r^{16}$, $r^{17}$, $r^{18}$, $r^{19}$ and $r^{20}$ respectively are alkyl group, alkenyl group, aryl group or aralkyl group, $r^{21}$, $r^{22}$, $r^{23}$ and $r^{24}$ respectively are hydrogen atom, halogen atom, alkyl group, alkoxy group, aryl group or amino group, r and $r^{22}$, $r^{23}$ and $r^{24}$, $r^{21}$ and $r^{23}$ or $r^{22}$ and $r^{24}$ may be combined with each other to form a ring, $x^3$ and $x^4$ are oxygen atoms, sulfur atoms or selene atoms, $m^2$ and $n^2$ are integers 0 to 3 that are not zero simultaneously, $r^{12}$ to $r^{24}$ may have a substituent or not, it is preferable that $X^3$ and $X^4$ be sulfur atoms, it is preferable that each of $r^{12}$ to $r^{15}$ be hydrogen atom, halogen atom, alkyl group, alkenyl group, aryl group or aralkyl group, in particular, it is preferable that $r^{12}$ and $r^{13}$ or $r^{14}$ and $r^{15}$ be combined with each other to form a naphthonucleus, the naphthonucleus may be substituted with an alkyl group or a halogen atom, it is preferable that each of $r^{16}$ to $r^{20}$ be an alkyl group, it is preferable that $r^{21}$ to $r^{24}$ be hydrogen or alkyl group, and $m^2$ and $n^2$ be integers holding a relationship $m^2+n^2=2$.

Preferred examples of the sensitizing dye (b) are as follows.

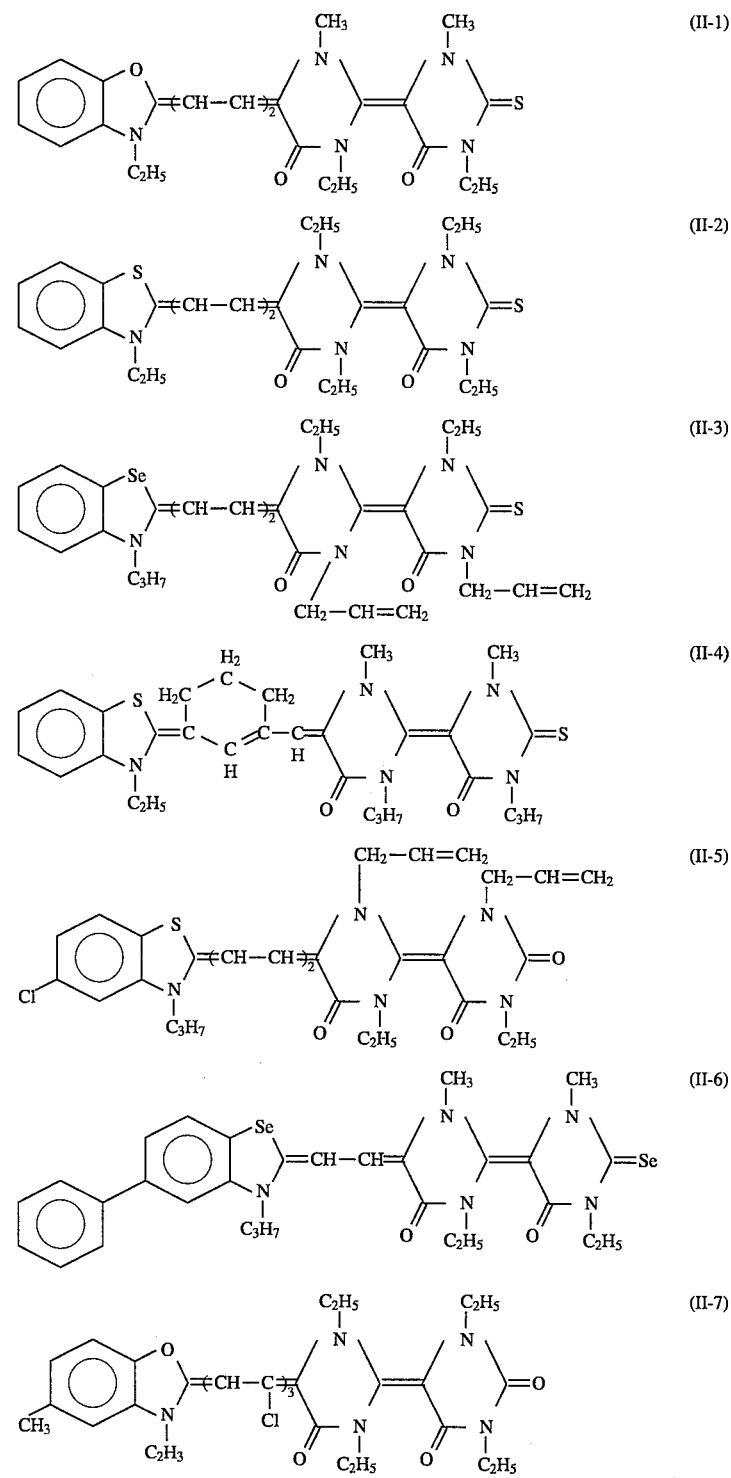

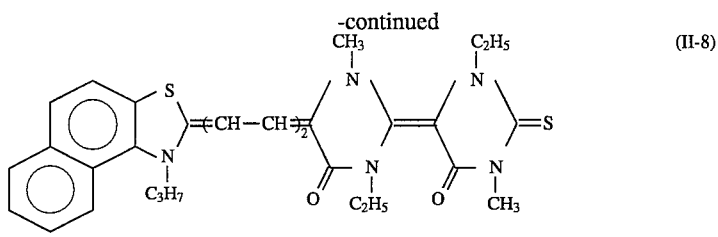

(II-8)

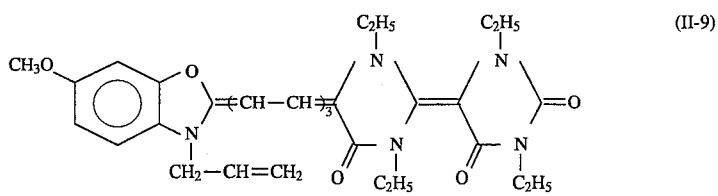

(II-9)

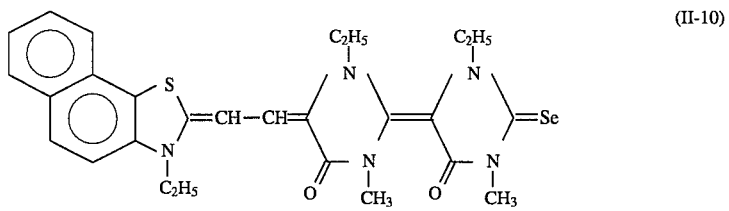

(II-10)

The sensitizing dye (c) will now be described.

As the oxazole nucleus, it is preferable that aromatic oxazole nucleus be employed, more preferably benzoxazole nucleus or naphthoxazole nucleus be employed. As the thiazole nucleus, it is preferable that aromatic thiazole nucleus be employed, more preferably benzoxazole nucleus or naphthoxazole nucleus be employed.

Among oxazolidone nucleus, thiazolidone nucleus and dihydroimidazolidone nucleus, it is preferable that oxazolidone nucleus or thiazolidone nucleus be employed, more preferably thiazolidone nucleus be employed.

The sensitizing dye (c) has, in one molecule thereof, two combining groups for combining nuclei with each other. It is preferable that the two combining groups be combined groups of a type having a methine chain. It is preferable that the number of methines of one combining group be 1 to 5. If the one combining group in one molecule has an even number of methines, it is preferable that the number of another combining group has an odd number of methines.

It is preferable that the sensitizing dye (c) has a structure expressed by the following general formula (III).

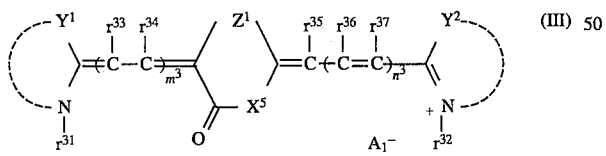

(III)

where $A_1^-$ is substituted or unsubstituted alkyl sulfonic acid ion, substituted or unsubstituted aromatic sulfonic acid ion, $NO_3^-$, $Cl^-$, $Br^-$, $I^-$ or $ClO_4^-$, $X^5$ is substituted or unsubstituted imino group, $y^1$ and $y^2$ respectively are oxygen atom or sulfur atom, $r^{31}$ and $r^{32}$ respectively are substituted or unsubstituted alkyl group, substituted or unsubstituted aryl group or substituted or unsubstituted aralkyl group, $Z^1$ is oxygen atom, sulfur atom, selenium atom or substituted or unsubstituted imino group, $r^{33}$, $r^{34}$, $r^{35}$, $r^{36}$ and $r^{37}$ respectively are hydrogen atom, halogen atom, substituted or unsubstituted alkyl group, alkoxy group, substituted or unsubstituted aryl group or substituted or unsubstituted amino group, $r^{33}$ and $r^{34}$, $r^{36}$ and $r^{37}$, $r^{35}$, $r^{36}$ and $r^{37}$ may form a ring, $m^3$ and $n^3$ are integers 1 to 3, it is preferable that $r^{31}$ and $r^{32}$ be alkyl groups, more preferably ethyl groups, it is preferable that $r^{33}$ to $r^{37}$ be hydrogen atoms or alkyl groups, it is preferable that $m^3$ and $n^3$ be integers holding a relationship $m^3+n^3=2$ to 4.

Preferred examples of the sensitizing dye (c) are as follows.

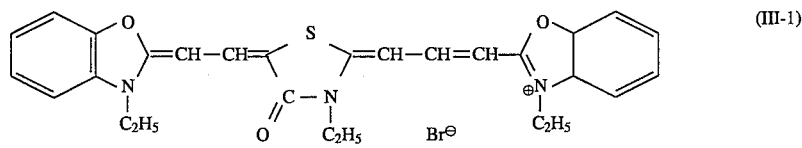

(III-1)

-continued

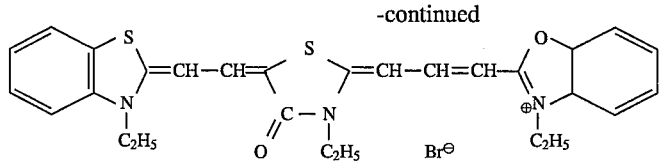

(III-2)

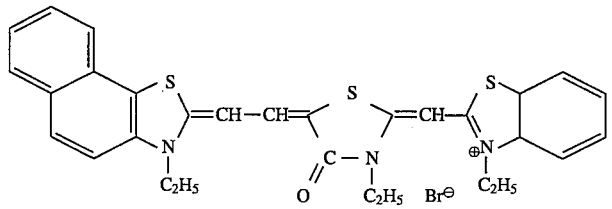

(III-3)

(III-4)

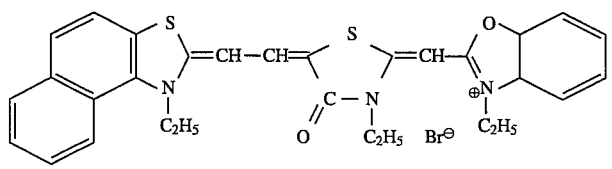

(III-5)

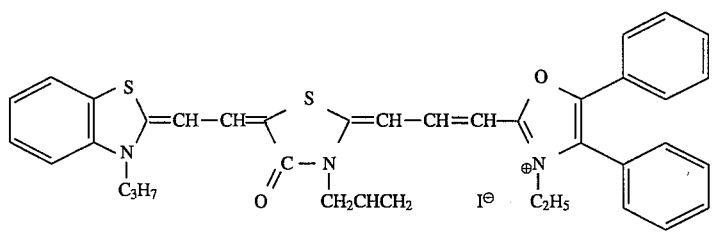

(III-6)

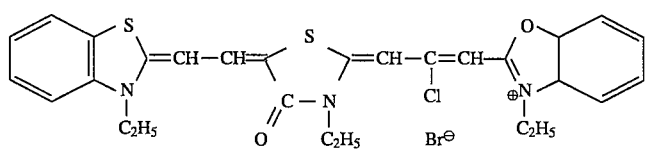

(III-7)

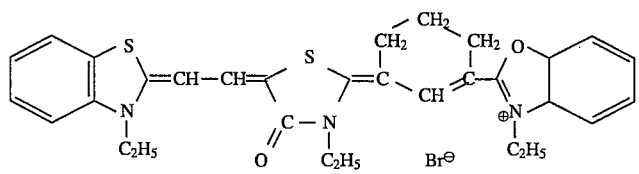

As the organic silver salt, an organic silver salt or triazole silver salt disclosed in "Basis of Photographic Engineering", 247, chapter "Non-silver salt" edited by , Japan Photography Institute and published by Corona Corp., Tokyo, No. 1 edition, 1982, or Japanese Patent Laid-Open No. 59-55429 may be employed. It is preferable that a silver salt having a low sensitivity be employed. For example, any one of a silver salt selected from the following group may be employed; the group consisting of aliphatic carboxylic acid, aromatic carboxylic acid, thiol, thiocarbonyl compound having α-hydrogen or a compound containing an imino group.

The aliphatic carboxylic acid is exemplified by acetic acid, butyric acid, succinic acid, sebacic acid, adipic acid, oleic acid, linolic acid, linolenic acid, tartaric acid, palmitic acid, stearic acid, behenic acid and camphoric acid. Since the silver salt is generally instable if the number of carbon atoms decreases, it is preferable that a compound having an adequate number of carbon atoms (for example, 16 to 26 carbon atoms) be employed.

The aromatic carboxylic acid is exemplified by benzoic acid derivative, quinolinic acid derivative, naphthalene carboxylic acid derivative, salicylic acid derivative, gallic acid derivative, tannic acid, phthalic acid, phenylacetic acid derivative and pyromellitic acid.

The thiol or thiocarbonyl compound having α-hydrogen is exemplified by dithiocarboxylic acids such as 3-mercapto-4-phenyl-1,2,4-triazole, 2-mercapto-4-phenyl, 1,2,4-triazole, 2-mercaptobenzoimidazole, 2-mercapto- 5-aminothiadiazole, 2-mercaptobenzothiazole, S-alkylthioglycol acid (the alkyl group having 12 to 23 carbon atoms), and dithioacetic acid, thioamido such as thiostearoamide, and mercapto compounds disclosed in U.S. Pat. No. 4,123,274, such as 5-carboxy-1-methyl- 2-phenyl-4-thiopyridone, mercaptotriazine, 2-mercaptobenzoxazole, mercaptoxathiazole or 3-amino-5-benzylthio-1,2,4-triazole.

The compound having an imino group is exemplified by benzotriazole or its derivative disclosed in Japanese Patent Publication No. 44-30270 or Japanese Patent Publication No. 45-18416, for example, an alkyl substituted benzotriazole such as benzotriazole or methylbenzotriazole, a halogen substituted benzotriazole such as 5-chlorobenzotriazole, a carboimidobenzotriazole such as butyl carboimidobenzotriazole, nitrobenzotriazole disclosed in Japanese Patent Laid-Open No. 58-118639, sulfobenzotriazole, carboxybenzotriazole or their salts or hydroxybenzotriazole disclosed in Japanese Patent Laid-Open No. 58-115638, and 1,2,4-triazole, 1H-tetrazole, carbazole, saccharin, imidazole and their derivatives disclosed in U.S. Pat. No. 4,220,709.

As the reducing agent, all materials (preferably organic materially) of a type capable of reducing silver ions into a metal silver may be employed.

The reducing agent is exemplified by monophenol, bisphenol, trisphenol, tetrakisphenol, mononaphthol, bisnaphthol, dihydroxynaphthalene, sulfonamidophenol, biphenol, trihydroxynaphthalene, dihydroxybenzene, trihydroxybenzene, tetrahydroxybenzene, hydroxyalkylmonoether, ascorbic acid, 3-pyrazolidone, pyrazolone, pyrazoline, sugars, phenylenediamine, hydroxyamine, reductone, hydroxamine, hydrazine, hydrazido, amidoxime, and N-hydroxyurea. Among the foregoing substance, it is preferable that p-bisphenol, o-bisphenol, bisnaphthol or 4-substituted naphthol be employed. A reducing agent disclosed in Japanese Patent Laid-Open No. 3-135564 may be employed.

The photosensitive silver halide is exemplified by silver chloride, sliver bromide, silver chlorobromide, silver bromoiodide and silver chlorobromoiodide.

As a method of preparing the silver halide, a method in which a portion of an organic silver salt is halogenated by a photosensitive silver halide forming component, such as ammonium bromide, lithium bromide, sodium chloride or N-bromo succinimide imide to prepare the silver halide and a method a so-called system-outside silver halide is contained are exemplified.

The shape of crystal of the silver halide is exemplified by a cubic shape, octahedral shape and flat shape. It is preferable that the cubic or flat shape be employed. A preferred length of one side of crystal of the cubic silver halide is 0.01 to 2 µm, more preferably 0.02 to 0.5 µm. It is preferable that the mean aspect ratio of the flat silver halide be 100:1 to 3:1, more preferably 50:1 to 5:1. It is preferable that the diameter of its particle be 0.01 to 2 µm, more preferably 0.02 to 0.5 µm.

The silver halide may contain iridium ions in the surface layer of the crystal thereof. The "surface layer of the crystal" is a layer having a predetermined depth from the surface of the crystal. It is preferable that the shape of the silver halide crystal be a tetragon having planes (1,0,0). It is preferable that the thickness of the surface layer of the crystal containing iridium ions be 10% or less of the length of the one side of the crystal, more preferably 5% or less. It is preferable that the surface layer of the crystal containing iridium ions be 0.5 % or longer than the length of one side of the crystal.

The silver halide containing iridium ions can be prepared by injecting a member for supplying iridium ions when the silver halide is obtained from an irreducible organic silver salt and a component for forming the silver halide. It is preferable that the member for supplying iridium ions be iridium tetrachloride, iridium hexachloride (IV) potassium or iridium hexachloride (IV) sodium.

Iridium ions can be contained in the surface layer of silver halide crystal by injecting the member for supplying iridium ions after a short time has passed from the commencement of the generation of the silver halide. For example, the injection of the member for supplying iridium ions may be commenced at a moment 90 wt % of a predetermined quantity of the silver halide is generated.

Although the overall portion of the silver halide according to the present invention may contain iridium ions, a mixture of a silver halide containing iridium ions and a silver halide containing no iridium ions may be employed.

It is preferable that the content of iridium ions be $1\times10^{-8}$ mole to $1\times10^{-4}$ mole with respect to 1 mole of silver halide, more preferably $1\times10^{-7}$ to $1\times10^{-6}$ mole.

The heat developing photosensitive member according to the present invention may contain cyanine dye expressed by general formula (IV). Employing the cyanine dye expressed by general formula (IV) improves the storing characteristics in an unused state and the resolution.

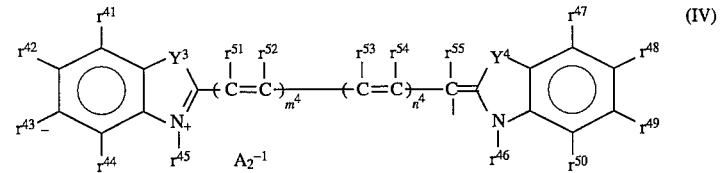

where $r^{41}$, $r^{42}$, $r^{43}$, $r^{44}$, $r^{47}$, $r^{48}$, $r^{49}$, $r^{49}$ and $r^{50}$ respectively are hydrogen atom, halogen atom, alkyl group, alkoxy group, aryl group or amino group, $r^{41}$ and $r^{42}$, $r^{42}$ and $r^{43}$, $r^{43}$ and $r^{44}$, $r^{47}$ and $r^{48}$, $r^{49}$ and $r^{49}$ or $r^{49}$ and $r^{50}$ may be combined with each other to form a ring, $r^{51}$, $r^{52}$, $r^{53}$, $r^{54}$ and $r^{55}$ respectively are hydrogen atom, alkyl group or aryl group, $r^{51}$ and $r^{53}$, $r^{52}$ and $r^{54}$, and $r^{53}$ and $r^{55}$ may be combined with each other to form a ring, $r^{45}$ and $r^{46}$ respectively are alkyl group or aralkyl group, $Y^3$ and $Y^4$ respectively are oxygen atom, sulfur atom, carbon atom or nitrogen atom, if the they are carbon atoms or nitrogen atoms any one of hydrogen atom, alkyl group, aryl group or aralkyl group is combined, $A^-_2$ is an anion, $m^4$ and $n^4$ respectively are 0, 1 or 2, it is preferable that $A^-_2$ be bromine, iodine, chlorine, perchloric acid, tetrafluoroborate, toluenesulfonate or arsenic hexafluoride, it is preferable that $Y^3$ and $Y^4$ respectively be oxygen atoms or nitrogen atoms, if $r^{45}$ and $r^{46}$ each have an anion such as carboxylic alkyl group or sulfonic acid alkyl $A^-_2$ is not sometimes present, it is preferable that $m^4$ and $n^4$ are not zero simultaneously, and it is preferable that $m^4 + n^4$ be 2.

Preferred examples of the cyanine dye expressed by general formula (IV) are as follows.

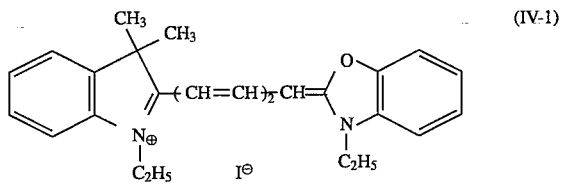

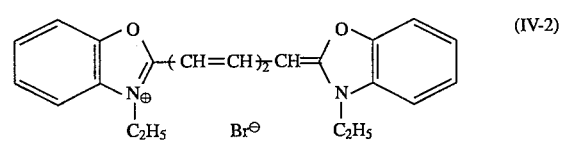

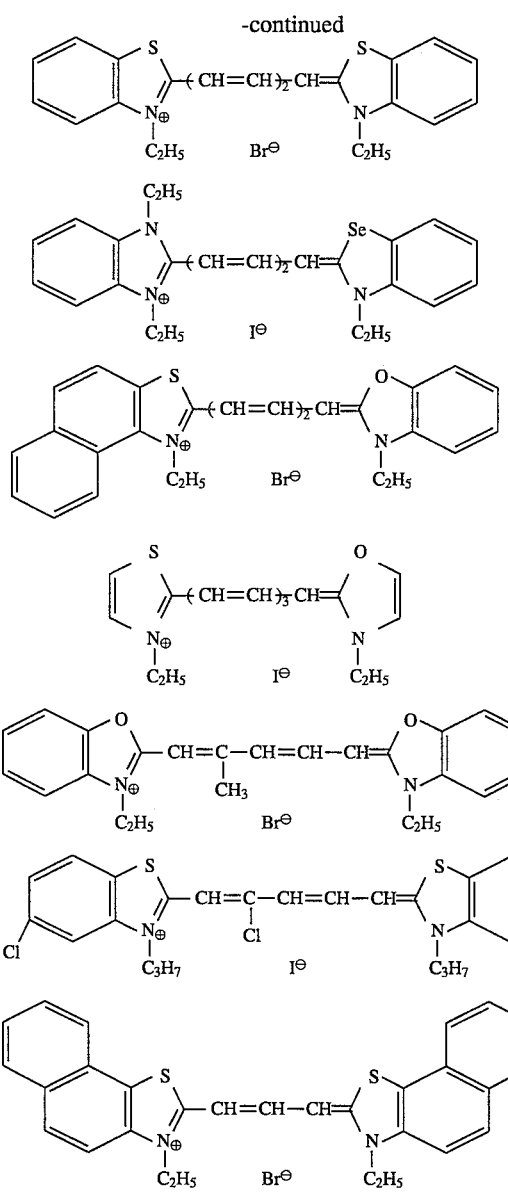

It is preferable that an adequate binder be contained in the photosensitive layer. The binder of the component (d) is exemplified by: an ester of cellulose, such as nitrocellulose, cellulose phosphate, cellulose sulfate, cellulose acetate, cellulose propionate, cellulose butyrate, cellulose myristate, cellulose palmitate, cellulose acetate propionate or cellulose acetate butyrate; an ether of cellulose, such as methyl cellulose, ethyl cellulose, propyl cellulose or butyl cellulose; a vinyl polymer, such as polystyrene, polyvinyl chloride, polyvinyl acetate, polyvinyl butyral, polyvinyl acetal, polyvinylalcohol or polyvinyl pyrrolidone; a copolymer such as copolymer of styrene and butadiene, copolymer of styrene and acrylonitrile, copolymer of styrene, butadiene and acrylonitrile or copolymer of vinyl chloride and vinyl acetate; an acryl polymer such as polymethylmethacrylate, polymethylacrylonitrile, polybutylacrylate, polyacrylic acid, polymethacrylic acid, polyacrylamide or polyacrylonitrile; a polyester such as polyethylene terephthalate; a polyacrylate polymer such as poly (4,4-isopropylidene-diphenylene-co-1,4-cyclohexylenedimethylene carbonate), poly (ethylenedioxy-3,3'-phenylenethiocarbonate), poly (4,4'-isopropylidenediphenylene carbonate-co-terephthalate), poly (4,4'-isopropylidenediphenylene carbonate), polyamide, poly (4,4'-sec-butylidenephenylene carbonate) or poly (4,4'-isopropylidenediphenylene carbonate-block-oxyethylene); a polyimide; an epoxy polymer; a phenol polymer; a polyolefin such as polyethylene, polypropylene or chlorinated polyethylene; and natural resin such as gelatin or synthetic resin. In particular, it is preferable that polyvinyl acetal such as polyvinyl butyral or polyvinyl formal or vinyl copolymer such as vinyl chloride acetate vinyl copolymer be employed.

The heat developing photosensitive member according to the present invention may contain a thiol compound expressed by the following general formula (V) or (VI). The heat developing photosensitive member according to the present invention may contained both thiol compounds respectively expressed by the following general formulas (V) and (VI). The contained thiol compound improves the sensitivity and the stoking characteristics in an unused state. Furthermore, the temperature control required in the heat developing process can be moderated (that is, the heat developing latitude can be widened).

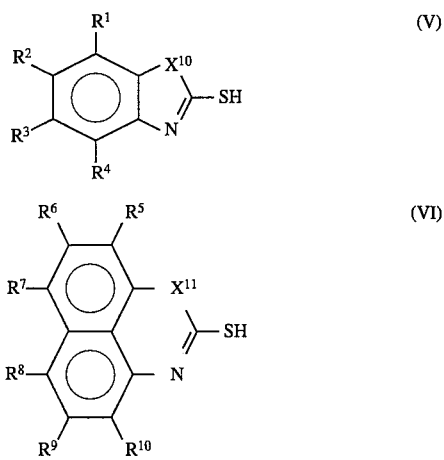

where $R^1$ to $R^{10}$ respectively are hydrogen atom, substituted or unsubstituted alkyl group, substituted or unsubstituted alkoxy group or carboxylic group, substituted or unsubstituted aryl group or sulfonic acid group, substituted or unsubstituted amino group, nitro group, halogen atom, amido group, alkenyl group or alkenyl group $R^1$ and $R^2$, $R^2$ and $R^3$, and $R^3$ and $R^4$ respectively may form a contraction ring, $X^{10}$ and $X^{11}$ respectively are —O—, —N (R11)— or —S—, $R^{11}$ is hydrogen, alkyl group or aryl group.

Preferred examples of the thiol compound expressed by general formula (V) or (VI) are as follows:

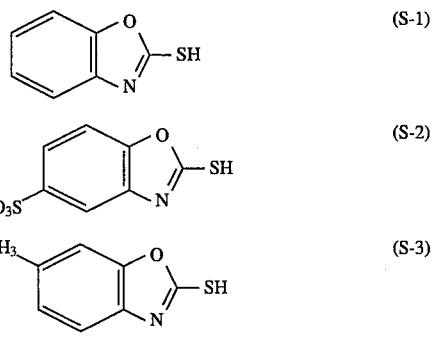

(S-4) 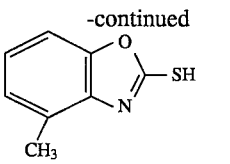

(S-5) 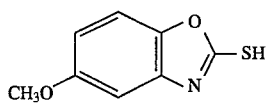

(S-6) 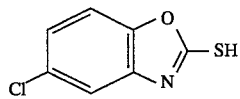

(S-7) 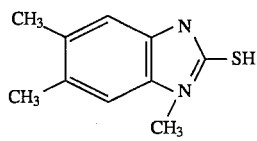

(S-8) 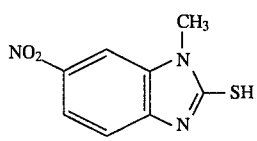

(S-9) 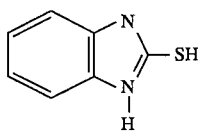

(S-10) 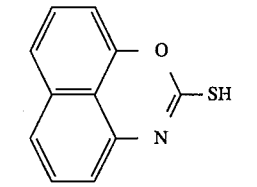

(S-11) 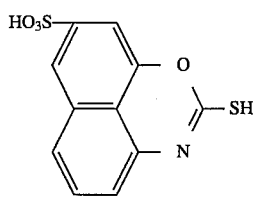

(S-12) 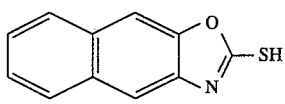

(S-13) 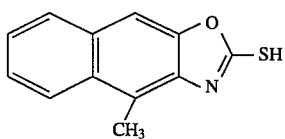

(S-14) 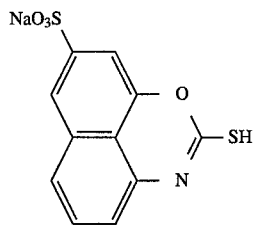

The photosensitive member according to the present invention may contain a color-tone adjuster if necessary. The color-tone adjuster is exemplified by phthalazinone or its derivatives disclosed in U.S. Pat. No. 3,080,254, a circular imide disclosed in Japanese Patent Laid-Open No. 46-6074 and a phthalazinone compound disclosed in Japanese Patent Laid-Open No. 50-32927.

The photosensitive member according to the present invention may contain an organic acid if necessary to improve the color tone of a formed image and stability after the image has been formed. In particular, it is preferable that a long-chain fatty acid be contained solely or in a combined manner.

The heat developing photosensitive member according to the present invention contains the components mixed at the following mixture ratio:

It is preferable that the content of the organic silver salt be 5 to 70 wt % of the photosensitive layer, more preferably 20 to 50 wt %. Even if the photosensitive layer is in the form of a multi-layer as described later, the content of the organic silver salt is contained in a quantity as described above with respect to the overall photosensitive layer.

It is preferable that the content of the reducing agent be 0.05 to 3 moles with respect to one mole of the organic silver salt, more preferably 0.2 to 2 moles.

It is preferable that 0.001 to 2 moles, preferably 0.05 moles to 1 mole photosensitive silver halide be contained with respect to one mole of organic silver salt. In the present invention, a silver halide forming agent, such as tetrabutyl ammonium bromide, N-bromosuccinimide or a halogen compound of bromide or iodine may be contained in place of the silver halide. In this case, the content of the silver halide forming agent may be determined similarly to the case of the silver halide.

It is preferable that the sensitizing dye expressed by any one of the general formula (I) to (III) be $1 \times 10^{-5}$ to $1 \times 10^{-2}$ moles with respect to one mole of the organic silver salt, more preferably $10^{-4}$ to $1 \times 10^{-3}$ moles.

It is preferable that the content of the cyanine dye contained if necessary and expressed by general formula (IV) be $1 \times 10^{-5}$ to $1 \times 10^{-2}$ moles, more preferably $1 \times 10^{-4}$ to $1 \times 10^{-3}$ moles with respect to one mole of the organic silver salt.

It is preferable that the content of the thiol compound contained if necessary and expressed by general formula (V) or (VI) be $1.0 \times 10^{-1}$ to $2.0 \times 10^{2}$ moles, more preferably $5.0 \times 10^{-1}$ to $1.0 \times 10^{2}$ moles, and most preferably 1.0 to $8.0 \times 10$ moles with respect to one mole of the sensitizing pigment by general formula (I) to (III).

It is preferable that the content of the binder contained if necessary be 0.5 to 10 parts by weight with respect to 1 part by weight of the organic silver salt, more preferably 0.5 to 5 parts by weight.

It is preferable that the organic acid contained if necessary be 25 mol % to 200 mol % with respect to the organic silver salt, more preferably 30 mol % to 120 mol %.

It is preferable that the content of the color-tone adjuster contained if necessary be 0.01 to 5 moles, more preferably 0.05 to 2 moles, and most preferably 0.08 to 1 mole with respect to one mole of the organic silver salt.

The photosensitive member according to the present invention may contain an adequate fog preventive agent. The fog preventive agent is exemplified by a mercury compound disclosed in Japanese Patent Publication No. 47-111113, 1,2,4-triazole compound disclosed in Japanese Patent Publication No. 55-42375, a tetrazole compound disclosed in Japanese Patent Laid-Open No. 57-30828, a benzoic acid disclosed in Japanese Patent Laid-Open No.

57-138630, a compound having a sulfonylthio group disclosed in Japanese Patent Laid-Open No. 57-147627 and a dibasic acid disclosed in Japanese Patent Laid-Open No. 58-107534. It is preferable that the dibasic acid disclosed in Japanese Patent Laid-Open No. 58-107534 be employed.

The photosensitive member according to the present invention may contain a coloring preventive agent, if necessary to prevent coloring of a non-image portion due to light after the image has been formed. It is preferable that the coloring preventive agent be a compound disclosed in Japanese Patent Laid-Open No. 61-129642 for example.

The photosensitive member according to the present invention may contain a development promoting agent, if necessary. A preferred development promoting agent is exemplified by an alkali metal salt compound of a fatty acid disclosed in Japanese Patent Publication No. 64-8809 for example.

The photosensitive member according to the present invention may contain a surface active agent containing fluorine, if necessary. Both surface active agent containing fluorine disclosed in Japanese Patent Laid-Open No. 64-24245 and a nonion surface active agent may be contained.

The photosensitive member according to the present invention may contain an ultraviolet-ray absorbing agent, a halation preventive dye (layer) and an irradiation preventative dye, if necessary. It may contain a fluorescent whitening agent.

The thermal developing photosensitive member according to the present invention can be obtained by forming a single or a plurality of layers containing the foregoing components on an adequate supporting member. If the photosensitive layer is formed into a multi-layer structure, it is preferable that the multi-layer is composed of layers respectively containing the organic silver salt, the silver halide and the sensitizing dye expressed by general formula (I) to (III) and a layer containing the reducing agent. The thio compound contained if necessary and expressed by general formula (V) or (VI) is contained in the layer containing the sensitizing dye.

The supporting member may be:a synthetic resin film made of polyethylene, polypropylene, polyethylene terephthalate, polycarbonate or cellulose acetate; synthetic paper; paper covered with a synthetic resin film such as polyethylene; paper such as art paper or barayta paper for photography; a metal plate (or foil) made of aluminum; a synthetic resin film having an evaporated metal film; or glass.

In order to improve transparency of the heat developing photosensitive member, thickening the density of the formed image, improving the natural storing characteristics, and, if necessary, improving the heat resistance of the photosensitive member, a protective layer may be formed on the photosensitive layer. It is preferable that the thickness of the protective layer be 1 μm to 20 μm. If it is thinner than the foregoing value, the desired effect cannot be obtained. If it is thicker than the same, any particular advantage cannot be obtained while raising the cost. A preferred polymer for use in the protective layer has heat resistance, and it is colorless and soluble in a solvent. It is exemplified by polyvinyl chloride, polyvinyl acetate, a copolymer of vinyl chloride and vinyl acetate (preferably vinyl chloride being 50 mol % or more), polyvinyl butyral, polystyrene, polymethyl methacrylate, benzylcellulose, ethylcellulose, cellulose acetatebutyrate, cellulose diacetate, cellulose triacetate, polyvinylidene chloride, chlorinated polypropylene, polyvinyl pyrrolidone, cellulose propionate, polyvinyl formal, cellulose acetate butyrate, polycarbonate, cellulose acetate propionate, gelatin, a gelatin derivative such as phthalic gelatin, acrylamidopolymer, polyisobutylene, copolymer of butadiene and styrene (at an arbitrary monomer ratio), and polyvinyl alcohol. In addition to the foregoing binders, colloidal silica may be contained in the protective layer.

It is preferable that the polymer for the protective layer has heat resistance of 115° or higher and a refractive index of 1.45 or higher at 20° C.

In a case where the layers respectively having the functions, such as the photosensitive layer and the protective layers are individually formed in the heat developing photosensitive member according to the present invention, the foregoing layers may be applied by any one of a variety of coating methods. The layers can be formed by an air knife method, a curtain coating method or an extruding coating method using a hopper as disclosed in U.S. Pat. No. 2,681,294. In this case, two or more layers may be applied simultaneously.

The heat developing photosensitive member according to the present invention causes the organic silver salt and the reducing agent to take part in the reducing reactions in a portion exposed to an image due to the image exposure and the applied heat (heat development). Metal silver generated due to the reactions form a blackened image.

The heat developing photosensitive member may use the light absorbance of an oxidized member (a material obtained by oxidizing the reducing agent) generated due to the redox reactions to form a pattern depending upon the difference in the light absorbance. That is, the pattern may be formed using the difference in the light absorbance such that light having a specific wavelength is absorbed in a portion in which the oxidized substance has been generated (the image exposure portion) and light absorption is limited in a portion in which no oxidized substance is generated (portion omitted from image exposure).

By using the difference in the light absorbance, the heat developing photosensitive member according to the present invention enables a pattern to be formed, the pattern being composed of a polymerized portion and a non-polymerized portion (hereinafter called a polymerized and non-polymerized pattern). That is, a polymerizable polymer precursor and a light polymerization initiator are contained in the photosensitive layer according to the present invention, and image exposure, heat development and polymerizing exposure are caused to undergo so that the polymerized and non-polymerized pattern can be formed. The reason why the polymerized and non-polymerized pattern can be formed is that silver or oxidized substance generated in the image exposure portion due to the oxidation and reduction reactions taking part in the heat developing process inhibits the polymerization, while the polymerization occurs in the non-image-exposure portion.

Although the polymerizable polymer precursor and the light polymerization initiator may be contained in the photosensitive layer, a polymerized layer containing the polymerizable polymer precursor and the light polymerization initiator may be formed individually from the photosensitive layer.

The photosensitive layer and the polymerized layer may be stacked in an order as the polymerized layer and the photosensitive layer from when viewed from the supporting member. They may be stacked in an order as the photosensitive layer and the polymerized layer when viewed from the supporting member. As an alternative to this, the photosensitive layer may be formed on either side of the supporting member and the polymerized layer may be formed on the other side with the supporting member interposed therebetween.

It is preferable that the thickness of the photosensitive layer be 0.1 μm to 50 μm, more preferably 1 μm to 30 μm, and most preferably 2 μm to 20 μm. In a case where the photosensitive layer is formed into a multi-layer structure, each photosensitive layer has substantially the same thickness.

A method of forming an image by using the photosensitive member according to the present invention will now be described.

Since the photosensitive member according to the present invention contains the sensitizing agents expressed by general formulas (I) to (III) as described above, excellent sensitivity and heat developing characteristics while having a sensitivity capable of sensing red and near infrared ray region. Therefore, when the photosensitive according to the present invention is exposed to image exposure corresponding to a desired image with a semiconductor laser beam or LED light, in particular, light of 640 nm to 750 nm, a silver nucleus is generated and thus a latent image is initially formed. Then, heat applied adequately will cause redox reactions to take place so that an image corresponding to the image exposure is developed.

The image forming method according to the present invention and capable of forming an image as described above can easily be treated in the process and adaptable to a mechanical process. Since it is able to use semiconductor laser beam or LED light, the size of the system can be made to be compact while attaining an economical advantage. The photosensitive member according to the present invention is free from the reciprocity failure even if a short time image exposing of $1 \times 10^{-5}$ sec/dot to $1 \times 10^{-7}$ sec/dot is performed.

The heat developing photosensitive member according to the present invention containing the polymerizable polymer precursor and the light polymerization initiator is able to form the polymerized and non-polymerized pattern by performing polymerizing exposure to the entire surface of the heat developing photosensitive member from a position facing the photosensitive layer after the foregoing image exposure and the heat development have been completed.

The light source for use in the polymerizing exposure process may be sunlight, tungsten lamp, mercury lamp, halogen lamp, xenon lamp, fluorescent lamp, LED or laser beam.

The wavelength of the light for the polymerizing exposure may be the same as that of the image exposing light or may be another wavelength.

Since the photosensitive silver halide usually has excellent photosensitivity superior to that of the light polymerization initiator even if the same wavelength is used, writing of a latent image can be performed with light of an intensity of a degree with which light polymerization does not undergo in the foregoing image exposure process. It is preferable that the exposure be performed with light of 100 μJ/cm², more preferably 30 μJ/cm², and most preferably 15 μJ/cm² on the surface of the photosensitive member in the image exposure process. It is preferable that exposure be performed with light of 500 mJ/cm² on the surface of the photosensitive member in the polymerizing exposure process. If the polymerizing exposure is not performed, the image exposure process is performed under the foregoing condition.

The photosensitive member according to the present invention may be developed with heat by any one of a variety of means. For example, the photosensitive member may be brought into contact with a simple heating plate or the like. It may be brought into contact with a heated drum. It may be allowed to pass through a heated space on the situation. It may be heated with high frequency waves or laser beams. It is preferable that the heating temperature be 80° C. to 160°, more preferably 100° C. to 160° C., and most preferably 110° C. to 150° C. By lengthening the heating duration or by shortening it, it may be used at a further high temperature or a further low temperature within the foregoing range. The developing period is usually one to 60 seconds, preferably 3 to 20 seconds.

As described above, an image exhibiting excellent quality can be obtained while being free from reciprocity failure and a problem of fog even if the exposure is performed with a high illuminance applied in a short time by means of the laser or the like. Furthermore, the heat developing photosensitive member according to the present invention exhibits excellent stocking characteristics.

The present invention will now be described further in detail with reference to examples.

EXAMPLE 1

A photosensitive composition having the following composition was prepared with safety light applied to the same.

| | |
|---|---|
| Polyvinylbutyral | 5.0 g |
| Silver Behenate | 2.5 g |
| Behenic Acid | 2.0 g |
| Silver Bromide | 0.2 g |
| Phthalazinone | 1.0 g |
| 2,2'-methylene bis (6-t-butyl-4-methylphenol) | 1.0 g |
| Xylene | 30 ml |
| n-butanol | 30 ml |

The silver bromide is in the form of cubic crystal, the plane index of which was {100} and an average length of one side of which was 0.07 μm.

5 mg of the sensitizing dye (I-7) was dissolved in 5 ml of N,N-dimethyl formamide (DMF). The solution thus obtained was added to the foregoing photosensitive composition. The composition was applied to the upper surface of a polyethylene terephthalate (PET) film to have a dry thickness of 10 μm so that a photosensitive layer was formed. Furthermore, a protection layer was formed by applying a polyvinyl alcohol layer having a dry thickness of 2 μm so that the heat developing photosensitive member according to the present invention was obtained.

The thus-obtained heat developing photosensitive member was subjected to evaluations of the sensitivity and the fog density immediately after the photosensitive member had been formed, the sensitivity and the fog density after it had been stored for a long time without being used. The storage conditions were such that it was stored for 72 hours in an environment, the temperature of which was 50° C. and the relative humidity of which was 80% RH.

The sensitivity and the fog density were measured in such a way that an image was formed on the heat developing photosensitive member and the transmitted optical density (O.D) of the formed image was measured.

That is, the fog density was the transmitted optical density realized when the image exposing energy was 0.1 μJ/cm² The sensitivity was defined to be the value of image exposing energy required to realize the transmitted optical density which was a value obtained by adding 0.5 to the fog density. Therefore, the sensitivity is obtained from the characteristics curve of the reflected optical density and the fog density with respect to the image exposing energy.

The transmitted optical density was measured by using a transmission/reflection color density meter NLM-STD-Tr (manufactured by Narumi).

The image was formed such that the heat developing photosensitive member was exposed to an image with a semiconductor laser, the wavelength of which was 670 nm. Then, heat development was performed for 10 seconds in a heat developing unit set to 118° C. The diameter of the semiconductor laser beam spot was 20 μm×40 μm and the exposing speed was $1.67 \times 10^{-7}$ sec/dot.

The characteristics curve of the reflected optical density with respect to the image exposure energy was made such that images were formed with various image exposing energies and the transmitted optical densities of the obtained images were measured.

The obtained sensitivity and the fog density were shown in Table 1.

Further, the resolution of the foregoing heat developing photosensitive member was evaluated as follows.

Initially, the heat developing photosensitive member was exposed to an image at resolutions 300 dpi, 600 dpi and 900 dpi by using semiconductor laser beams, the wavelength of which was 680 nm. Then, heat development was performed for 10 seconds in a heat developing unit set to 120° C. so that an image was formed. The diameter of the semiconductor laser beam stop was 20 μm×40 μm, the image exposing energy was 30 μJ/cm² at the surface of the photosensitive member, and the exposing speed was $1.67 \times 10^{-7}$ sec/dot.

The transmitted optical density of the image exposed portion and the non-image-exposed portion between the image exposed portions of the obtained image were measured so that the resolution of the image was evaluated. The transmitted optical density to evaluate the resolution was measured by using a microspectroscope UMSP manufactured by Karltzwise with light, the wavelength of which was 550 nm±5 nm. The results of the evaluation of the resolution were shown in Table 2.

EXAMPLE 2

The heat developing photosensitive member according to the present invention was manufactured under the same conditions as those of Example 1 except use of the foregoing sensitizing dye (II-2) in place of the sensitizing dye (I-7) used in Example 1.

The sensitivity and the fog density of the heat developing photosensitive member were measured similarly to Example 1. The results of the measurements were shown in Table 1. The resolution of the heat developing photosensitive member was measured similarly to Example 1. The results of the measurement was shown in Table 2.

EXAMPLE 3

The heat developing photosensitive member according to the present invention was manufactured under the same conditions as those of Example 1 except use of the foregoing sensitizing dye (III-3) in place of the sensitizing dye (I-7) used in Example 1.

The sensitivity and the fog density of the heat developing photosensitive member were measured similarly to Example 1. The results of the measurements were shown in Table 1. The resolution of the heat developing

Comparative Examples 1, 2 and 3

Three types heat developing photosensitive members were manufactured under the same conditions as those of Example 1 except use of the following sensitizing pigment (R-1), (R-2) or (R-3) in place of the sensitizing pigment (I-7) used in Example 1.

The sensitivity and the fog density of the heat developing photosensitive member were measured similarly to Example 1. The results of the measurements were shown in Table 1.

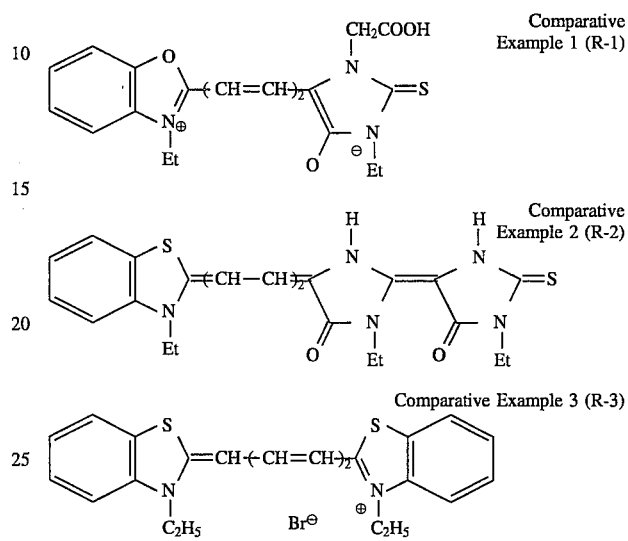

EXAMPLE 4

A photosensitive composition having the following composition was prepared with safety light applied to the same.

| | |
|---|---|
| Polyvinylbutyral | 3.0 g |
| Silver Behenate | 2.5 g |
| Behenic Acid | 1.5 g |
| Silver Bromide | 0.6 g |
| Homophthalic acid | 0.6 g |
| Phthalazinone | 0.5 g |
| 2,2'-methylene bis (4,6-di-t-butylphenol) | 2.6 g |
| Xylene | 30 ml |
| n-butanol | 40 ml |

The silver bromide is in the form of cubic crystal, the plane index of which was {100} and an average length of one side of which was 0.06 μm.

1.5 mg of the sensitizing dye (I-7) and 5 mg of cyanine dye (IV-4) were dissolved in 10 ml of N,N-dimethyl formamide (DMF). Solution thus obtained was added to the foregoing photosensitive composition.

The photosensitive composition, to which the sensitizing dye (I-7) and the cyanine dye (IV-4) were added, was applied to the upper surface of a polyethylene terephthalate (PET) film to have a dry thickness of 10 μm so that a photosensitive layer was formed. Furthermore, a protection layer was formed by applying a polyvinyl alcohol layer having a dry thickness of 2 μm so that the heat developing photosensitive member according to the present invention was obtained.

The thus-obtained heat developing photosensitive member was subjected to evaluations of the sensitivity and the fog density immediately similarly to Example 1.

The results of the measurements were shown in Table 1. Further, the resolution of the foregoing heat developing photosensitive member was evaluated similarly to Example 1, the results being shown in Table 2.

EXAMPLE 5

The heat developing photosensitive member according to the present invention was manufactured under the same conditions as those of Example 4 except use of the foregoing sensitizing dye (II-2) in place of the sensitizing dye (I-7) used in Example 4.

The sensitivity and the fog density of the heat developing photosensitive member were measured similarly to Example 1. The results of the measurements were shown in Table 1. The resolution of the heat developing photosensitive member was measured similarly to Example 1. The results of the measurement was shown in Table 2.

EXAMPLE 6

The heat developing photosensitive member according to the present invention was manufactured under the same conditions as those of Example 4 except use of the foregoing sensitizing dye (III-3) in place of the sensitizing dye (I-7) used in Example 4.

The sensitivity and the fog density of the heat developing photosensitive member were measured similarly to Example 1. The results of the measurements were shown in Table 1. The resolution of the heat developing photosensitive member was measured similarly to Example 1. The results of the measurement was shown in Table 2.

TABLE 1

|  | Initial Stage | | Post Durability Test | |
|---|---|---|---|---|
|  | Sensitivity ($\mu J/cm^2$) | Fog Density | Sensitivity ($\mu J/cm^2$) | Fog Density |
| Example 1 | 4.5 | 0.14 | 4.4 | 0.15 |
| Example 2 | 5.6 | 0.10 | 6.3 | 0.10 |
| Example 3 | 5.2 | 0.15 | 6.0 | 0.16 |
| Example 4 | 3.9 | 0.14 | 3.9 | 0.14 |
| Example 5 | 5.0 | 0.10 | 5.2 | 0.10 |
| Example 6 | 4.8 | 0.15 | 5.0 | 0.15 |
| Comparative Example 1 | 980.0 | 0.14 | 1264.0 | 0.21 |
| Comparative Example 2 | 17.5 | 0.80 | 24.3 | 0.91 |
| Comparative Example 3 | 22.5 | 0.12 | 31.2 | 0.20 |

TABLE 2

|  |  | Resolution | | |
|---|---|---|---|---|
|  |  | 300 dpi | 600 dpi | 900 dpi |
| Example 1 | Density of Exposed Portion | 2.85 | 2.57 | 2.16 |
|  | Density of Un-Exposed portion | 0.46 | 0.51 | 0.63 |
| Example 2 | Density of Exposed Portion | 2.65 | 2.47 | 1.98 |
|  | Density of Un-Exposed portion | 0.30 | 0.32 | 0.39 |
| Example 3 | Density of Exposed Portion | 2.67 | 2.54 | 2.09 |
|  | Density of Un-Exposed portion | 0.50 | 0.57 | 0.68 |
| Example 4 | Density of Exposed Portion | 2.90 | 2.74 | 2.43 |
|  | Density of Un-Exposed portion | 0.21 | 0.27 | 0.39 |
| Example 5 | Density of Exposed Portion | 2.75 | 2.59 | 2.36 |
|  | Density of Un-Exposed portion | 0.18 | 0.25 | 0.34 |
| Example 6 | Density of Exposed Portion | 2.80 | 2.64 | 2.39 |
|  | Density of Un-Exposed portion | 0.34 | 0.38 | 0.42 |

As can be understood from Table 1, the heat developing photosensitive member according to the present invention exhibits superior sensitivity and low fog density to those of the conventional heat developing photosensitive member.

Furthermore, as can be understood from Table 2, use of the cyanine dye improves the resolution.

Although the invention has been described in its preferred form with a certain degree of particularly, it is understood that the present disclosure of the preferred form can be changed in the details of construction and the combination and arrangement of parts may be resorted to without departing from the spirit and the scope of the invention as hereinafter claimed.

What is claimed:

1. A heat developing photosensitive member comprising:

a photosensitive layer containing at least an organic silver salt, a reducing agent, a photosensitive silver halide or a photosensitive silver halide forming agent and a sensitizing dye; and a supporting member for supporting said photosensitive layer thereon, wherein said sensitizing dye is a merocyanine dye having a structure represented by formula I as follows:

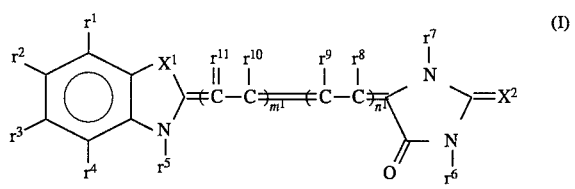

wherein $r^1$, $r^2$, $r^3$ and $r^4$ are each hydrogen, halogen, alkyl, alkoxy, alkenyl, aralkyl, hydroxyl, aryl, carboxyl, alkoxycarbonyl, cyano, trifluoromethyl, amino, acylamide, acyl, acyloxy, alkoxycarbonyl, amino or carboalkoxy, $r^1$ and $r^2$, $r^2$ and $r^3$ and $r^4$ are combined with each other to form a six-membered ring, $r^5$, $r^6$ and $r^7$ are each alkyl, alkenyl, aryl or aralkyl, $r^8$, $r^9$, $r^{10}$ and $r^{11}$ are each hydrogen, halogen, alkyl, alkoxy, aryl or amino, $r^8$ and $r^9$, $r^{10}$ and $r^{11}$, $r^8$ and $r^{10}$ or $r^9$ and $r^{11}$ are optionally combined with each other to form a ring, $X^1$ is sulfur of selenium, $X^2$ is oxygen, sulfur, or selenium and $m^1$ and $n^1$ are each an integer from 0 to 3 and are not zero simultaneously.

2. A heat developing photosensitive member comprising:

a photosensitive layer containing at least an organic silver salt, a reducing agent, a photosensitive silver halide or a photosensitive silver halide forming agent and a sensitizing dye; and a supporting member for supporting said photosensitive layer thereon, wherein said sensitizing dye is a merocyanine dye having a structure represented by formula II as follows:

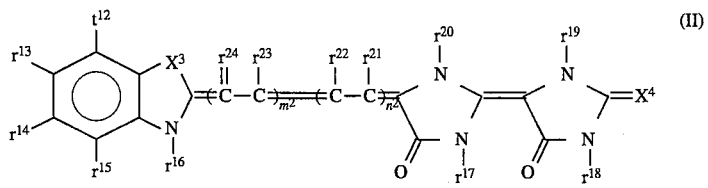

wherein $r^{12}$, $r^{13}$, $r^{14}$ and $r^{15}$ are each hydrogen, halogen, alkyl, alkoxy, alkenyl, aralkyl, hydroxyl, aryl, carboxyl, alkoxycarbonyl, cyano, trifluoromethyl, amino, acylamide, acyl, acyloxy, alkoxycarbonylamino or carboalkoxy, $r^{12}$ and $r^{13}$, $r^{13}$ and $r^{14}$ or $r^{14}$ and $r^{15}$ are optionally combined with each other to form a five or six-membered ring, $r^{16}$, $r^{17}$, $r^{18}$, $r^{19}$ and $r^{20}$ are each alkyl, alkenyl, aryl, or aralkyl, $r^{21}$, $r^{22}$, $r^{23}$ and $r^{24}$ are each hydrogen, halogen, alkyl, alkoxy, aryl, or amino, $r^{21}$ and $r^{22}$, $r^{23}$ and $r^{24}$, $r^{21}$ and $r^{23}$ or $r^{22}$ and $r^{24}$ are optionally combined with each other to form a ring, $X^3$ and $X^4$ are oxygen, sulfur or selenium, $m^2$ and $n^2$ are each integers from 0 to 3 and are not zero simultaneously.

3. A heat developing photosensitive member according to claim 1 or 2, wherein cyanine dye expressed by general formula (IV) is contained in said photosensitive layer,

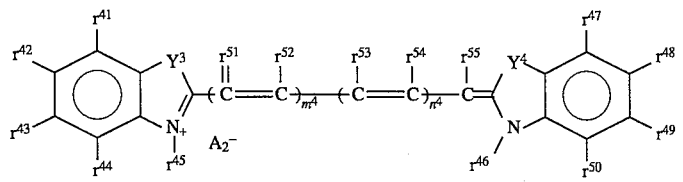

wherein $r^{41}$, $r^{42}$, $r^{43}$, $r^{44}$, $r^{47}$, $r^{48}$, $r^{49}$ and $r^{50}$ are each hydrogen, halogen, alkyl, alkoxy, aryl, or amino, $r^{41}$ and $r^{42}$, $r^{42}$ and $r^{43}$, $r^{43}$ and $r^{44}$, $r^{47}$ and $r^{48}$, $r^{48}$ and $r^{49}$ or $r^{49}$ and $r^{50}$ are optionally combined with each other to form a ring, $r^{51}$, $r^{52}$, $r^{53}$, $r^{54}$ and $r^{55}$ are each hydrogen, alkyl or aryl, $r^{51}$ and $r^{53}$, $r^{52}$ and $r^{54}$, and $r^{53}$ and $r^{55}$ are optionally combined with each other to form a ring, $r^{45}$ and $r^{46}$ are each alkyl or aralkyl, $Y^3$ and $Y^4$ are each oxygen, sulfur, carbon or nitrogen, wherein when $Y^3$ and $^4$ are carbon, then they are substituted with a moiety selected from the group consisting of hydrogen, alkyl, aryl or aralkyl; and when $Y^3$ and $Y^4$ are nitrogen, then they are substituted with a moiety selected from the group consisting of hydrogen, alkyl, aryl or aralkyl, $A^-_2$ is an anion, and $m^4$ and $n^4$ are each 0, 1 or 2.

4. A heat developing photosensitive member comprising: a photosensitive layer containing at least an organic silver salt, a reducing agent, a photosensitive silver halide or a photosensitive silver halide forming agent, a sensitizing dye; and a supporting member for supporting said photosensitive layer thereon, wherein said sensitizing dye is selected from the group consisting of:

(a) a merocyanine dye having a structure represented by formula I as follows:

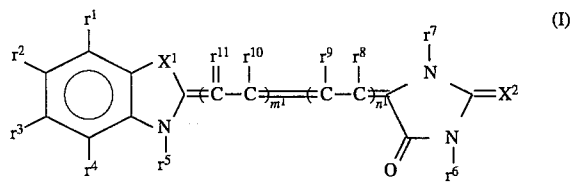

where $r^1$, $r^2$, $r^3$ and $r^4$ are each hydrogen, halogen, alkyl, alkoxy, alkenyl, aralkyl, hydroxyl, aryl, carboxyl, alkoxycarbonyl, cyano, trifluoromethyl, amino, acylamide, acyl, acyloxy, alkoxycarbonyl, amino or carboalkoxy, $r^1$ and $r^2$, $r^2$ and $r^3$ or $r^3$ and $r^4$ are combined with each other to form a six-membered ring, $r^5$, $r^6$ and $r^7$ are each alkyl, alkenyl, aryl or aralkyl, $r^8$, $r^9$, $r^{10}$ and $r^{11}$ are each hydrogen, halogen, alkyl, alkoxy, aryl or amino, $r^8$ and $r^9$, $r^{10}$ and $r^{11}$, $r^8$ and $r^{10}$ or $r^9$ and $r^{11}$ are optionally combined with each other to form a ring, $X^1$ is sulfur of selenium, $X^2$ is oxygen, sulfur, or selenium and $m^1$ and $n^1$ are each an integer from 0 to 3 and are not zero simultaneously, and (b) a merocyanine dye having a structure represented by formula II as follows:

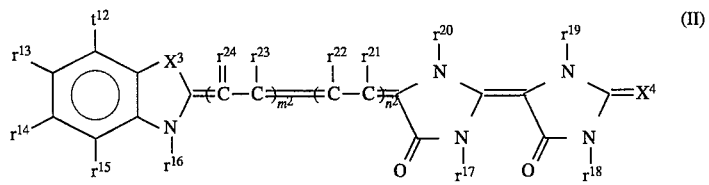

(II)

wherein $r^{12}$, $r^{13}$, $r^{14}$ and $r^{15}$ are each hydrogen, halogen, alkyl, alkoxy, alkenyl, aralkyl, hydroxyl, aryl, carboxyl, alkoxycarbonyl, cyano, trifluoromethyl, amino, acylamide, acyl, acyloxy, alkoxycarbonylamino or carboalkoxy, $r^{12}$ and $r^{13}$, $r^{13}$ and $r^{14}$ or $r^{15}$ are optionally combined with each other to form a five or six-membered ring, $r^{16}$, $r^{17}$, $r^{18}$, $r^{19}$ and $r^{20}$ are alkyl, alkenyl, aryl, or aralkyl, $r^{21}$, $r^{22}$, $r^{23}$ and $r^{24}$ are each hydrogen, halogen, alkyl, alkoxy, aryl, or amino, $r^{21}$ and $r^{22}$, $r^{23}$ and $r^{24}$, $r^{21}$ and $r^{22}$ and $r^{24}$ are optionally combined with each other to form a ring, $X^3$ and $X^4$ are oxygen, sulfur or selenium, $m^2$ and $n^2$ are each integers from 0 to 3 and are not zero simultaneously.

5. A method of forming an image comprising the step of:

image-exposing and heating said heat developing photosensitive member according to claim 1 or 2 to form an image.

6. A method of forming an image according to claim 5, wherein said image exposure is performed by using a semiconductor laser or an LED.

* * * * *

UNITED STATES PATENT AND TRADEMARK OFFICE
CERTIFICATE OF CORRECTION

PATENT NO. : 5,482,814

DATED : January 9, 1996

INVENTOR(S): TAKEHIKO OOI ET AL.                    Page 1 of 7

It is certified that error appears in the above-identified patent and that said Letters Patent is hereby corrected as shown below:

```
 On the title page, item
  [56] REFERENCES CITED

Foreign Patent Documents,
    "64-24245  7/1983  Japan." should read
    --64-24245  1/1989  Japan.--.

COLUMN 1

Line 17, "involving" should be deleted.
     Line 25, "disclosure" should read --disclosures-- and
              "uses" should read --use--.

COLUMN 2

Line 17, "utilized" should read --sensitized--.
     Line 43, "hydantoinilidene-selinohydantoin" should read
              --hydantoinilidene-selenohydantoin--.

COLUMN 3

Line 22, "idene-selinohydantoin" should read
              --idene-selenohydantoin--.
```

UNITED STATES PATENT AND TRADEMARK OFFICE
CERTIFICATE OF CORRECTION

PATENT NO. : 5,482,814

DATED : January 9, 1996

INVENTOR(S): TAKEHIKO OOI ET AL.

It is certified that error appears in the above-identified patent and that said Letters Patent is hereby corrected as shown below:

COLUMN 4

Line 6, "five or" should read --five- or--.
    Line 11, "selene" should read --selenium--.
    Line 12, "selene" should read --selenium-- and "$n^2$" should read --$n^1$--.
    Line 59, "$CH_3$" should read --$C_2H_5$--.

COLUMN 5

Line 34, insert --(I-10)--.
    Line 40, "$C_3H_{7(I-10)}$" should read --$C_3H_7$--.

COLUMN 6

Line 1, "seleno hydantoin" should read --selenohydantoin--.
    Line 61, "five or" should read --five- or--.
    Line 65, "r" should read --$r^{21}$--.
    Line 66, "$x^3$" should read --$X^3$--.
    Line 67, "$x^4$" should read --$X^4$-- and "selene" shuld read --selenium--.

COLUMN 10

Line 30, "$y^1$ and $y^2$" should read --$Y^1$ and $Y^2$--.

COLUMN 11

Line 47, "by ," should read --by,--.

UNITED STATES PATENT AND TRADEMARK OFFICE
CERTIFICATE OF CORRECTION

PATENT NO. : 5,482,814

DATED : January 9, 1996

INVENTOR(S): TAKEHIKO OOI ET AL.

It is certified that error appears in the above-identified patent and that said Letters Patent is hereby corrected as shown below:

COLUMN 13

Line 14, "substance" should read --substances--.
    Line 36, "method" should read --method in which--.

COLUMN 14

Line 10, "$1 \times 10^{-7}$" should read --$1 \times 10^{-7}$ mole--.
    Line 29, "$r^{49}$" (first occurrence) should read --$r^{48}$--.
    Line 38, "the they" should read --they--.

COLUMN 15

Line 47, "by:an" should read --by: an--.

COLUMN 16

Line 17, "stoking" should read --storing--.
    Line 48, "—N(R11)—" should read -- —N($R^{11}$)— --.

COLUMN 18

Line 35, "formula (I)" should read --formulas (I)--.
    Line 47, "formula (I)" should read --formulas (I)--.
    Line 63, "47-111113," should read --47-11113,--.

UNITED STATES PATENT AND TRADEMARK OFFICE
CERTIFICATE OF CORRECTION

PATENT NO. : 5,482,814

DATED : January 9, 1996

INVENTOR(S): TAKEHIKO OOI ET AL.

It is certified that error appears in the above-identified patent and that said Letters Patent is hereby corrected as shown below:

COLUMN 19

Line 36, "formula" should read --formulas--.
    Line 41, "be:a" should read --be: a--.

COLUMN 20

Line 10, "layers" should read --layer,--.
    Line 23, "form" should read --forms--.
    Line 39, "polymerized" should read --"polymerized--.
    Line 40, "pattern)." should read --pattern").--.
    Line 44, "undergo" should read --occur--.
    Line 60, "from" (first occurrence) should be deleted.

COLUMN 21

Line 13, "characteristics" should read --characteristics are present,--.
    Line 15, "photosensitive" should read --photosensitive member--.
    Line 52, "undergo" should read --occur--.

COLUMN 22

Line 15, "stocking" should read --storing--.
    Line 61, "0.1 $\mu J/cm^2$" should read --0.1 $\mu J/cm^2$.--.

UNITED STATES PATENT AND TRADEMARK OFFICE
CERTIFICATE OF CORRECTION

PATENT NO. : 5,482,814

DATED : January 9, 1996

INVENTOR(S): TAKEHIKO OOI ET AL.

It is certified that error appears in the above-identified patent and that said Letters Patent is hereby corrected as shown below:

COLUMN 23

Line 19, "the,-" should read --the--.
Line 27, "stop" should read --spot--.
Line 48, "were" should read --are--.
Line 51, "was" should read --are--.
Line 62, "were" should read --are--.
Line 63, "developing" should read
--developing photosensitive member was measured similarly to Example 1. The results of the measurement are shown in Table 2.--.
Line 66, "types" should read -types of--.

COLUMN 24

Line 6, "were" should read --are--.

COLUMN 25

Line 9, "were" should read --are--.
Line 12, "was" should read --are--.
Line 24, "were" should read --are--.
Line 27, "was" should read --are--.

UNITED STATES PATENT AND TRADEMARK OFFICE
CERTIFICATE OF CORRECTION

PATENT NO. : 5,482,814

DATED : January 9, 1996

INVENTOR(S): TAKEHIKO OOI ET AL.

It is certified that error appears in the above-identified patent and that said Letters Patent is hereby corrected as shown below:

COLUMN 26

Line 16, "claimed:" should read --claimed is:--.
 Line 31, "$r^{11}$" should read --$r^{11}$--.
 Line 37, "hydroxyl,aryl," should read --hydroxyl, aryl,--.
 Line 47, "of" should read --or--.

COLUMN 27

Line 4, "$r^{24}$" should read --$r^{24}$--.
 Line 11, "alkenyl,aralkyl," should read --alkenyl, aralkyl,--.
 Line 16, "five or" should read --five- or--.
 Line 21, "$m^2$and" should read --$m^2$ and--.
 Line 31, "$r^{51}$" should read --$r^{51}$--.
 Line 47, "and $^4$" should read --and $Y^4$--.

COLUMN 28

Line 21, "$r^{11}$" should read --$r^{11}$--.
 Line 52, "of" should read --or--.

UNITED STATES PATENT AND TRADEMARK OFFICE
CERTIFICATE OF CORRECTION

PATENT NO. : 5,482,814

DATED : January 9, 1996

INVENTOR(S) : TAKEHIKO OOI ET AL.

It is certified that error appears in the above-identified patent and that said Letters Patent is hereby corrected as shown below:

COLUMN 29

Line 5, "$r^{24}\|$" should read --$r^{24}|$--.
Line 15, "$r^{15}$" should read --$r^{14}$ and $r^{15}$--.
Line 16, "five or" should read --five- or--.
Line 20, "and" (third occurrence) should read --and $r^{23}$ or--.

Signed and Sealed this

Fourth Day of June, 1996

BRUCE LEHMAN

Attest:

Attesting Officer    Commissioner of Patents and Trademarks